United States Patent
Hall et al.

(10) Patent No.: US 10,566,268 B1
(45) Date of Patent: Feb. 18, 2020

(54) PACKAGE TO DIE CONNECTION SYSTEM AND METHOD THEREFOR

(71) Applicant: NXP USA, INC., Austin, TX (US)

(72) Inventors: Mark Douglas Hall, Austin, TX (US); Walter J. Ciosek, Austin, TX (US); David Russell Tipple, Leander, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/142,623

(22) Filed: Sep. 26, 2018

(51) Int. Cl.
| | |
|---|---|
| *H01L 23/495* | (2006.01) |
| *H01L 25/04* | (2014.01) |
| *H01L 23/528* | (2006.01) |
| *H01L 23/00* | (2006.01) |
| *H01L 21/48* | (2006.01) |

(52) U.S. Cl.
CPC ........ *H01L 23/4952* (2013.01); *H01L 21/481* (2013.01); *H01L 21/4825* (2013.01); *H01L 23/49503* (2013.01); *H01L 23/49537* (2013.01); *H01L 23/49548* (2013.01); *H01L 23/49558* (2013.01); *H01L 23/49575* (2013.01); *H01L 23/5283* (2013.01); *H01L 24/05* (2013.01); *H01L 24/48* (2013.01); *H01L 24/73* (2013.01); *H01L 24/80* (2013.01); *H01L 25/04* (2013.01); *H01L 2224/05541* (2013.01); *H01L 2224/05567* (2013.01); *H01L 2224/48177* (2013.01); *H01L 2224/73251* (2013.01); *H01L 2224/80815* (2013.01)

(58) Field of Classification Search
None
See application file for complete search history.

(56) References Cited

U.S. PATENT DOCUMENTS

| | | | | |
|---|---|---|---|---|
| 7,569,421 | B2 * | 8/2009 | Do | H01L 21/6835 438/113 |
| 7,687,318 | B2 * | 3/2010 | Do | H01L 21/568 257/E21.516 |
| 8,080,444 | B2 | 12/2011 | Sarihan | |
| 8,237,271 | B2 * | 8/2012 | Cordes | H01L 21/6835 257/723 |
| 8,525,310 | B2 | 9/2013 | Chen et al. | |
| 8,729,694 | B2 * | 5/2014 | Do | H01L 21/76898 257/693 |
| 8,895,409 | B2 | 11/2014 | Uehling | |
| 9,209,143 | B2 * | 12/2015 | Seidemann | H01L 24/09 |
| 9,601,369 | B2 * | 3/2017 | Do | H01L 21/76898 |
| 9,620,473 | B1 | 4/2017 | Hall et al. | |
| 9,646,953 | B2 | 5/2017 | Kong et al. | |

(Continued)

OTHER PUBLICATIONS

Lu, T., "Rapid SoC Prototyping Utilizing Quilt Packaging Technology for Modular Functional IC Partitioning", ACM 2016.

*Primary Examiner* — Andres Munoz (57) ABSTRACT

A package to die connection system and method are provided. The system includes a semiconductor device having a substrate with a top surface. A gasket is affixed to the top surface of the substrate and has at least one cavity with a portion of the cavity open to a sidewall of the gasket. A semiconductor die is attached to the top surface of the substrate. A sidewall of the semiconductor die is abutted with the sidewall of the gasket. A portion of a metal layer is exposed to the open portion of the cavity. A pillar located in the cavity is electrically connected to the exposed portion of the metal layer.

20 Claims, 5 Drawing Sheets

(56) References Cited

U.S. PATENT DOCUMENTS

| | | | |
|---|---|---|---|
| 9,935,079 B1* | 4/2018 | Foong | H01L 24/83 |
| 2006/0081976 A1* | 4/2006 | Patel | H01L 23/4822 |
| | | | 257/697 |
| 2014/0268592 A1* | 9/2014 | Kulick | H05K 1/18 |
| | | | 361/748 |
| 2015/0305160 A1* | 10/2015 | Funahashi | H01L 23/49827 |
| | | | 348/374 |
| 2017/0162532 A1* | 6/2017 | Kulick | H01L 25/065 |
| 2018/0019208 A1* | 1/2018 | Kulick | H01L 23/5389 |

* cited by examiner

PACKAGE TO DIE CONNECTION SYSTEM AND METHOD THEREFOR

BACKGROUND

Field

This disclosure relates generally to semiconductor devices, and more specifically, to semiconductor devices having package to die connections.

Related Art

Today, many semiconductor devices, including microcontrollers and systems-on-a-chip (SoC) devices, are designed with ever increasing complexity. With increased complexity, the number of package to die connections increases dramatically. In some cases, dies are pad-limited which means that die sizes are dictated based only on the number of bond pads required to make package to die connections. Accordingly, pad-limited die are prime targets for die cost reductions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having electrical connections formed through sidewalls of a semiconductor die. Metal tabs formed from metal layers of the semiconductor die extend through the sidewalls such that cross-sectional surfaces of the metal tabs are exposed at the sidewalls. A gasket surrounding the semiconductor die is formed having cavities collocated with the exposed portions of the metal tabs. Conductive pillars located in the cavities form electrical connections with the exposed portions of the metal tabs. By forming electrical connections through sidewall of the semiconductor die, package to die connections can be realized without using bond pads.

Figure 1:
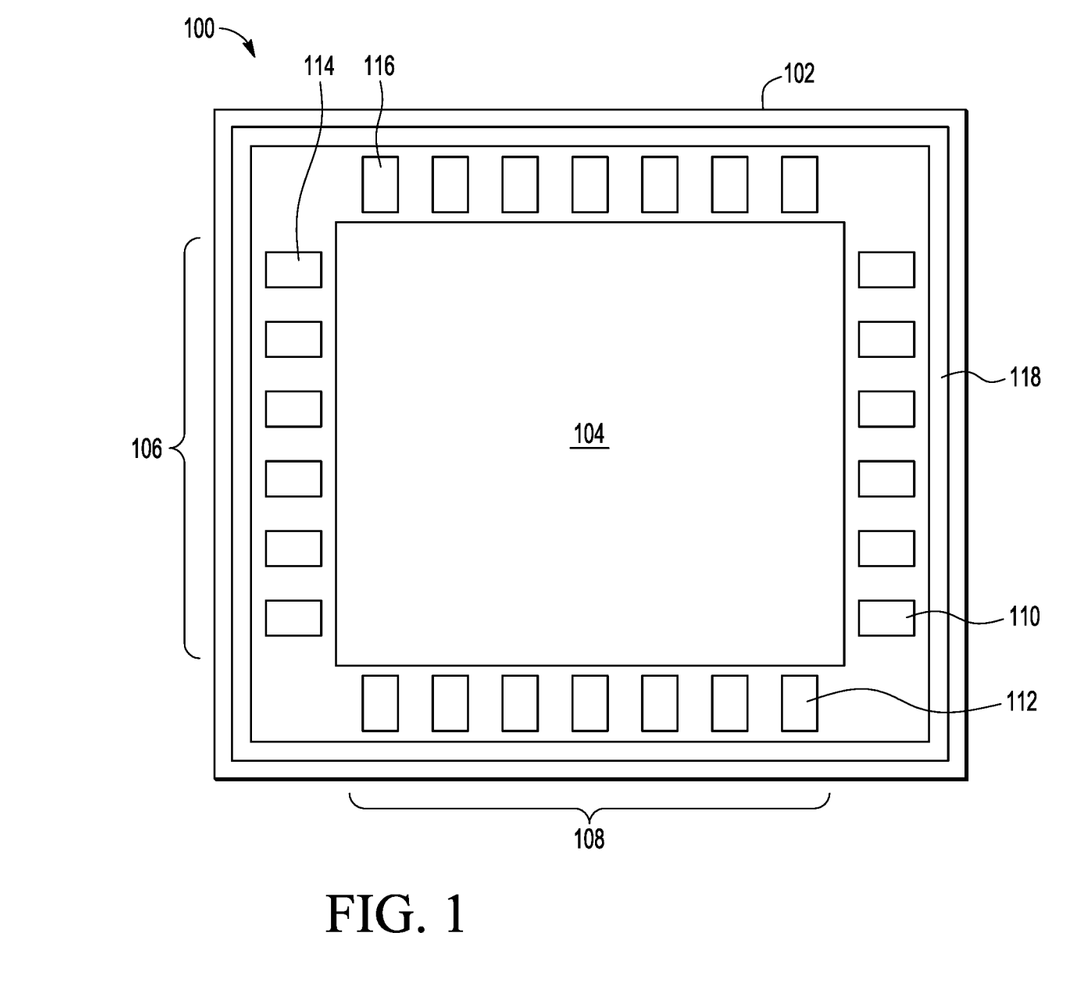
FIG. 1 illustrates, in a plan view, an example semiconductor die having bond pads.

FIG. 1 illustrates, in a plan view, an example semiconductor die 100 having bond pads. Die 100 includes an outer edge 102, core circuitry 104, a first group of bonding pads 106, a second group of bonding pads 108, supply pads 110-116, and a metal ring 118. The first group of bonding pads 106 includes bonding pads formed on both vertical sides of the die 100 and the second group of bonding pads 108 includes bonding pads formed on both horizontal sides of the die 100. Metal ring 118 is part of a seal ring structure formed between first and second groups of bonding pads 106, 108 and outer edge 102.

Die 100 includes supply pads 110-116 which, for illustrative purposes, are characterized as power-ground pairs. For example, bonding pads 110 and 112 are configured to be connected to power (e.g., VDD) and ground (e.g., VSS) voltage supply sources respectively. Likewise, bonding pads 114 and 116 are configured to be connected to power (e.g., VDD) and ground (e.g., VSS) voltage supply sources respectively. Power supply pads 110-116 are coupled to supply circuitry 104 with appropriate operating voltages (e.g., VDD, VSS).

In the example illustrated in FIG. 1, die 100 is pad-limited. For example, the number of bonding pads dictates the size of die 100. In order to make die 100 smaller in the same process technology, a number of bonding pads would need to be removed. However, removing bonding pads could reduce functionality or performance of die 100. Alternatively, it may be desirable to add additional input and/or output signals to die 100 without increasing the size of die 100.

Figure 2:
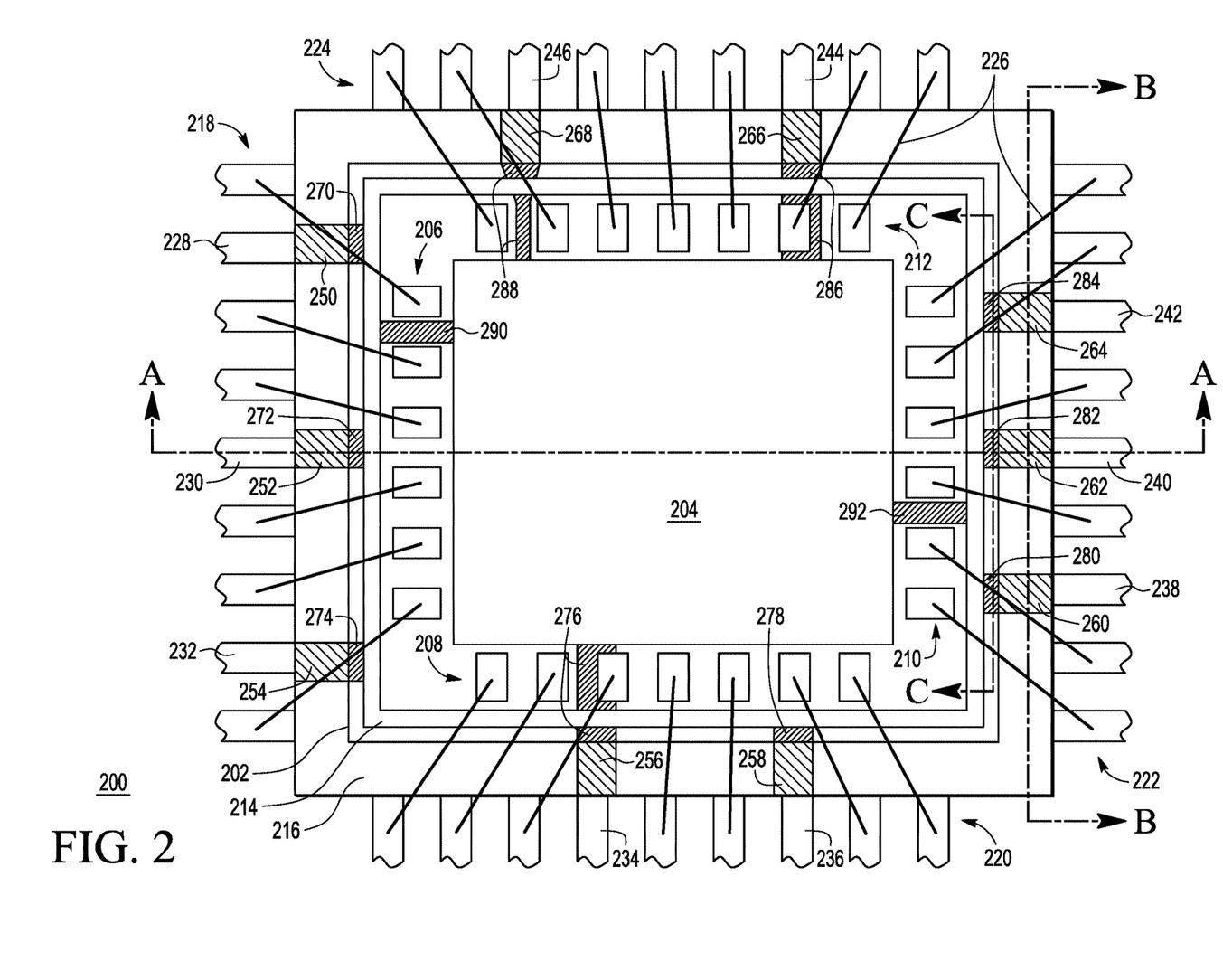
FIG. 2 illustrates, in a plan view, an example semiconductor device at a stage of manufacture in accordance with an embodiment.

FIG. 2 illustrates, in a plan view, an example semiconductor device 200 at a stage of manufacture in accordance with an embodiment. Device 200 includes semiconductor die 202, gasket 216, and package leads 218-224. In this embodiment, sidewalls of die 202 abut inner sidewalls of gasket 216 and ends of leads 218-224 abut outer sidewalls of gasket 216. Die 202 and gasket 216 are mounted on a same substrate (not shown). Cavities (250-268) formed in the gasket 216 have openings through the inner and outer sidewalls of the gasket 216. Metal tabs 270-288 are exposed at one end through the sidewalls of die 202 and are coupled to embedded metal layers and circuitry 204 within die 202. Exposed portions of metal tabs 270-288 are collocated with respective inner sidewall openings of the cavities (250-268) and ends of leads 228-246 are collocated with respective outer sidewall openings of the cavities (250-268). The term collocated, as used herein, refers to being located, situated, or placed side by side. Conductive pillars 250-268 are located in respective cavities and serve to form electrical connections between leads 228-246 and metal tabs 270-288.

Figure 3:
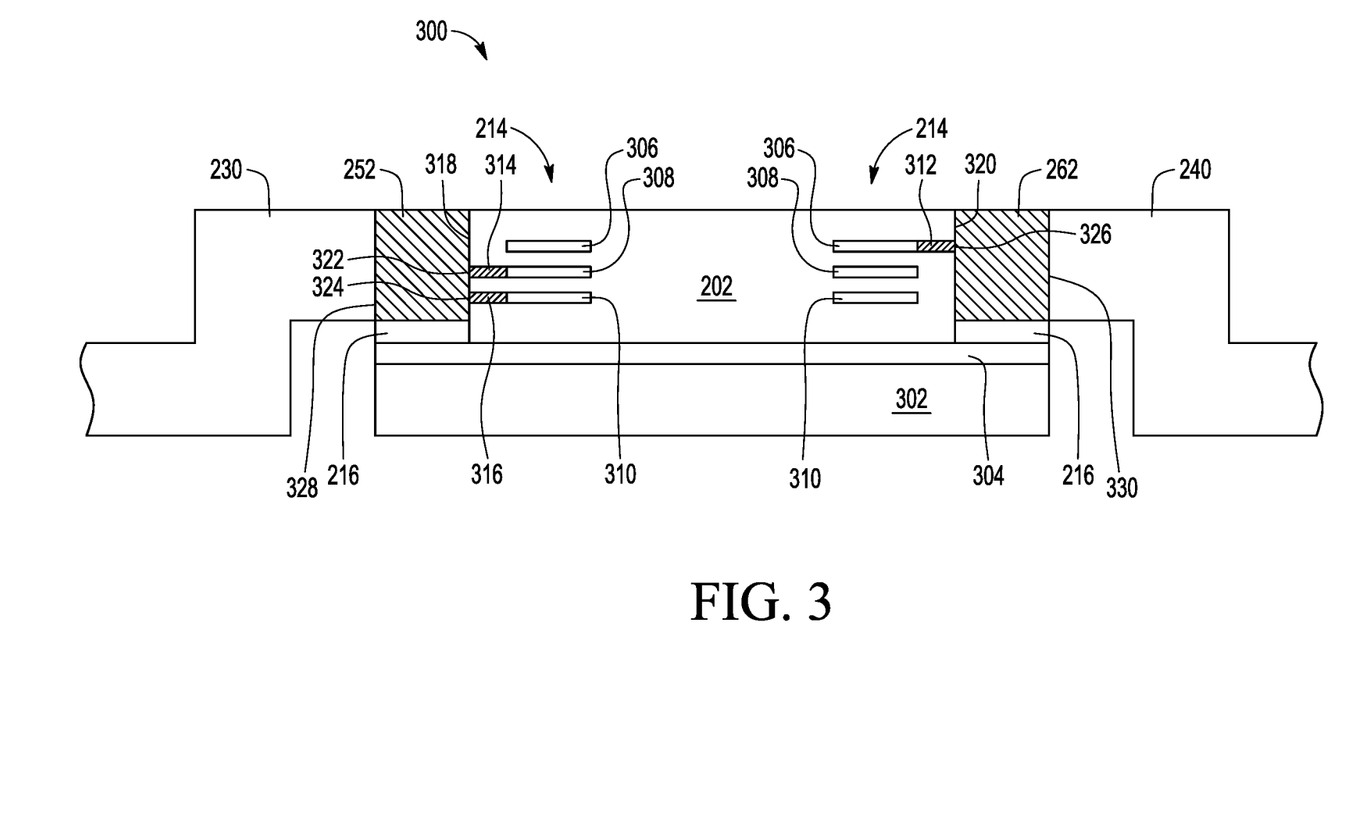
FIG. 3 illustrates, in a cross-sectional view, example package to die connectivity of the semiconductor device of FIG. 2 along line A-A in accordance with an embodiment.
Figure 4:
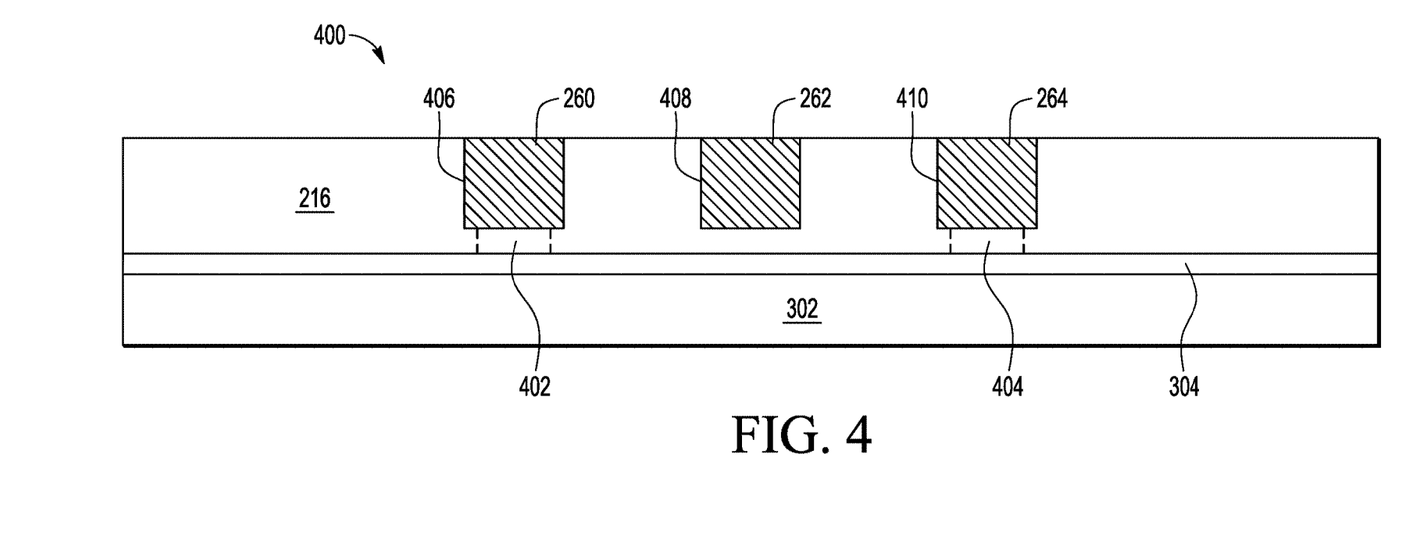
FIG. 4 illustrates, in a cross-sectional view, example pillar and gasket arrangement of the semiconductor device of FIG. 2 along line B-B in accordance with an embodiment.
Figure 5:
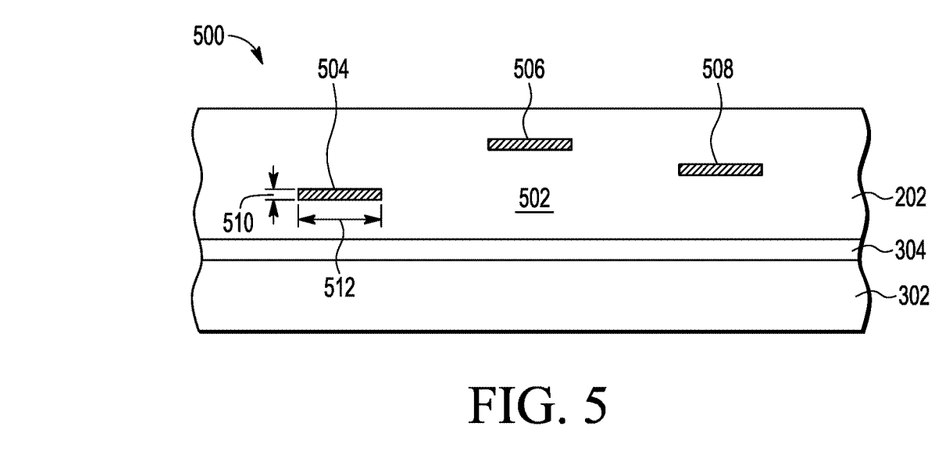
FIG. 5 illustrates, in a cross-sectional view, example die sidewall arrangement of the semiconductor device of FIG. 2 along line C-C in accordance with an embodiment.

A cross-sectional view of package to die connectivity taken along line A-A is shown in FIG. 3, a cross-sectional view of pillar and gasket structure taken along line B-B is shown in FIG. 4, and a cross-sectional view of die sidewall structure taken along line C-C is shown in FIG. 5.

Die 202 includes core circuitry 204, bonding pads 206-212, metal tabs 270-288 formed from portions of metal layers of the die 202, a metal stack ring 214 formed between bonding pads 206-212 and outer edges of the die 202, and internal metal layer portions 290-292 coupled between ring 214 and core circuitry 204. In this embodiment, core circuitry 204 may include any type of functional circuits and blocks or combinations thereof such as processors, memories, timers, serial communication units, analog circuits, PLLs, sensors, and others. Die 202 includes other circuitry (not shown) generally located around bonding pads 206-212 such as input buffer circuits, output buffer circuits, electrostatic discharge (ESD) circuits, and the like. In an embodiment, metal stack ring 214 is formed as a metal ring from each metal layer stacked over one another (e.g., second metal layer ring formed over first metal layer ring, third metal layer ring formed over second metal layer ring, and so on). Metal stack ring 214 may be incorporated as part of a seal ring structure around the perimeter of the die 202. Metal layers of die 202 may be formed from a variety of electrically conductive materials, such as copper, gold, silver, aluminum, nickel, tungsten, the like, and alloys thereof.

Metal tabs 270-288 may be formed from any suitable metal layers of die 202. First ends of metal tabs 270-288 are exposed at sidewalls of die 202 (see FIG. 5) and second ends of metal tabs 270-288 are coupled to the core circuitry 204. For example, the second end of metal tab 270 is connected to a metal layer ring in the metal stack ring 214 which is connected to core circuitry 204 by way of metal layer portion 290. In this example, metal tab 270, the metal layer ring, and the metal layer portion 290 are all formed from the same metal layer and are configured to supply power (e.g., VDD, nominal operating voltage) or ground (e.g., VSS, 0 volts) voltages to at least a portion of the core circuitry 204. Second ends of other metal tabs (e.g., 272-274, 278-284) may be connected to other metal layer rings in the metal stack ring 214 which are connected to core circuitry 204 by way of metal layer portions 290 and 292 or other metal layer portions (not shown). In another example, metal tabs 276, 286-288 extend through the metal layer stack ring 214 and pad areas having second ends connected to core circuitry 204. In this example, a portion of a metal layer ring may be omitted so that metal tabs 276, 286-288 can extend through metal stack ring 214 without connecting to metal layer rings in the metal stack ring 214.

Gasket 216 includes an inner sidewall and an outer sidewall and may be formed from any suitable non-conductive materials such as plastic or ceramic materials, for example. Gasket 216 and die 202 are mounted on a substrate (not shown). Inner dimensions of gasket 216 are approximately the same as outer dimensions of die 202 such that each sidewall of die 202 abuts a corresponding sidewall of the gasket 216 when mounted on the substrate. Cavities are formed in the gasket 216 and have openings through the inner sidewalls of the gasket 216 which are collocated with respective exposed portions of metal tabs 270-288. In an embodiment, the cavities have openings through the outer sidewalls opposite of the openings through the inner sidewalls of gasket 216.

Leads 218-224 are configured to substantially surround the outer perimeter of gasket 216. The leads 218-224 are characterized as package leads such as leadframe leads, for example. The leads 218-224 may be formed of any suitable electrically conductive material, such as aluminum, copper, silver, nickel, or iron, or alloys including one or more of these materials, for example. The conductive material may be bare, partially plated, or plated with another metal or an alloy such as iron/nickel alloy, silver, gold, copper, or the like. Ends of leads 218-224 abut the outer sidewall of gasket 216. Leads 218-224 include a bonding region for electrical connection by way of bond wires (e.g., bond wires 226) to corresponding bonding pads 206-212 at the top surface of die 202. The bond wires may be formed from a metal material including aluminum, copper, silver, or gold. The bond wires may be attached to the bonding pads 206-212 on semiconductor die 202 and the bonding region of leads 218-224 with either ball bonds or wedge bonds or a combination of ball bonds and wedge bonds. For example, ball bonds may be used to attach a first end of bond wires to bonding pads 206-212 on the semiconductor die 202 and wedge bonds may be used to attach the opposite ends of bond wires to the bonding region of leads 218-224. Leads 228-246 are aligned and collocated with corresponding cavities having openings through outer sidewalls of gasket 216. In an embodiment, leads 228-246 are characterized as voltage supply leads and configured to supply appropriate operating and ground voltages to semiconductor die 202. In other embodiments, one or more of leads 228-246 may be coupled to receive a non-critical timed signal such as a reset signal or a configuration signal (e.g., mode select signal).

Conductive pillars 250-268 are located in respective cavities. The conductive pillars 250-268 may be formed from any suitable reflowable materials (e.g., lead/tin solder). In some embodiments, the conductive pillars 250-268 may be formed having a conductive core pillar material (e.g., gold, copper, silver, nickel) encased by a conductive reflowable material. In an embodiment, the conductive pillars are formed as a copper pillar encased by a solder material. With the conductive pillars located in respective cavities, a heat treatment allows reflowable material of the pillars to reflow forming conductive paths with metal surfaces exposed to the cavities. For example, ends of leads 228-246 and ends of tabs 270-288 are exposed in respective cavities and electrically connected to one another after the conductive pillars 250-268 are reflowed when subjected to a heat treatment. In some embodiments, the conductive pillars 250-268 may be formed in the cavities by way of a metal deposition (e.g., tungsten deposition) process resulting in electrical connections between ends of leads 228-246 and ends of tabs 270-288 respectively.

Because power and ground can be supplied through the sidewalls of die 202, for example, a robust number of power and ground connections can be made without impacting die size. Also, by supplying power and ground through sidewall connections, pads normally dedicated for power and ground supplies can be eliminated (e.g., to reduce die size) or replaced with other signals (e.g., to enhance performance or functionality).

FIG. 3 illustrates, in a cross-sectional view, example package to die connectivity structure 300 of the semiconductor device 200 of FIG. 2 along line A-A in accordance with an embodiment. The structure 300 includes die 202 and gasket 216 mounted on substrate 302, and leads 230, 240.

Die 202 includes example metal layer ring 306-310 formed as metal stack ring 214 of FIG. 2. In this example, metal layer rings 306-310 are formed on separate metal layers of die 202. Metal layer ring 308 is formed over metal layer ring 310 and metal layer ring 306 is formed over metal layer ring 308. A first metal tab 312 has a first end 326 exposed at sidewall 320 and a second end connected to metal layer ring 306. First metal tab 312 and metal layer ring 306 are formed from a first metal layer of die 202. A second metal tab 314 has a first end 322 exposed at sidewall 318 and a second end connected to metal layer ring 308. Second metal tab 314 and metal layer ring 308 are formed from a second metal layer of die 202. A third metal tab 316 has a first end 324 exposed at sidewall 318 and a second end connected to metal layer ring 310. Third metal tab 316 and metal layer ring 310 are formed from a third metal layer of die 202. In this example, core circuitry and other circuitry (not shown) are connected to metal layer rings 306-310. The metal layers (e.g., first, second, third metal layers) of die 202 may be formed from a variety of electrically conductive materials, such as copper, gold, silver, aluminum, nickel, tungsten, the like, and alloys thereof. Dielectric material (not shown) is disposed between the metal layers of die 202. The dielectric material may be formed from a wide range of electrically isolating materials such as silicon dioxide, silicon nitride, silicon oxy-nitride, the like, and any combination of such materials. The dielectric material may be formed from a grown silicon oxide or a deposited oxide such as tetraethyl orthosilicate (TEOS) or a combination thereof, for example.

Gasket 216 is a fixture formed from a non-conductive material and mounted on substrate 302 along with die 202. Gasket 216 includes inner sidewalls that abut sidewalls 318 and 320 of die 202 and outer sidewalls that abut lead ends 328 and 330 of leads 230 and 240 respectively. Conductive pillar 252 is located in a first cavity formed in the gasket 216 and conductive pillar 262 is located in a second cavity formed in the gasket 216. In this embodiment, each of the first and second cavities formed in the gasket 216 includes a portion open through respective inner sidewall and a portion open through respective outer sidewall. Conductive pillar 252 forms an electrical connection between lead 230 and metal tabs 314-316 and conductive pillar 262 forms an electrical connection between lead 240 and metal tab 312.

Conductive pillars 252 and 262 may be formed having a conductive core pillar material (e.g., gold, copper, silver, nickel) encased by a conductive reflowable material. In an embodiment, the conductive pillars are formed as a copper pillar encased by a solder material. With the conductive pillars located in respective cavities, a heat treatment allows reflowable material of the pillars to reflow forming conductive paths with metal surfaces exposed to the cavities.

Substrate 302 may be formed from any suitable material such as a ceramic material or dielectric material, for example. A metal layer 304 may be formed at a top surface of substrate 302 and may be used as a grounded plane at the bottom side of die 202. In some embodiments, the substrate 302 may be characterized as a flag, die pad, or conductive die bonding portion of a leadframe.

Leads 230 and 240 may be formed as leads of a leadframe or other package leads. Leads 230 and 240 may be formed of any suitable electrically conductive material, such as aluminum, copper, silver, nickel, or iron, or alloys including one or more of these materials, for example. The conductive material may be bare, partially plated, or plated with another metal or an alloy such as iron/nickel alloy, silver, gold, copper, or the like. Ends of leads 230 and 240 abut the outer sidewall of gasket 216 and are collocated with cavity openings such that conductive pillars 252 and 262 form an electrical connection between leads 230 and 240 and metal tabs 312-316 respectively.

FIG. 4 illustrates, in a cross-sectional view, example pillar and gasket structure 400 of the semiconductor device of FIG. 2 along line B-B in accordance with an embodiment. The structure 400 includes gasket 216 mounted on substrate 302, and conductive pillars 260-264 located in respective cavities 406-410 of gasket 216.

Cavities 406-410 are formed in gasket 216. Conductive pillar 260 is located in cavity 406, conductive pillar 262 is located in cavity 408, and conductive pillar 264 is located in cavity 410. Substrate 302, as described above, may be formed from any suitable material. A metal layer 304 may be formed at a top surface of substrate 302 and may be used as a ground plane. In an embodiment, cavities 406 and 410 formed in the gasket 216 includes respective openings 402 and 404 through a bottom surface of gasket 216 such that during a metal deposition or reflow process, the conductive pillars 260 and 264 form an electrical connection with metal layer 304.

FIG. 5 illustrates, in a cross-sectional view, example die sidewall structure 500 of the semiconductor device of FIG. 2 along line C-C in accordance with an embodiment. Structure 500 includes die 202 mounted on substrate 302. Sidewall 502 is an outer edge of die 202 perpendicular to top and bottom surfaces of die 202. Sidewall 502 is formed when die 202 is singulated from a wafer. When die 202 is singulated, cross sectional portions of tabs 280-284 are formed as exposed surfaces 504-508 at sidewall 502. Because die 202 may be singulated by way of a saw or cleave process, a clean (e.g., HF solution) may be used to clear any debris or residual contaminants from the sidewall 502 surface. In an embodiment, the exposed surfaces 504-508 at sidewall 502 have height dimensions 510 approximately equal to the thickness of a corresponding metal layer and width dimensions 512 in a range of 10 microns to 100 microns. In some embodiments, the exposed surfaces 504-508 at sidewall 502 may have width dimensions 512 of less than 10 microns.

Figure 6:
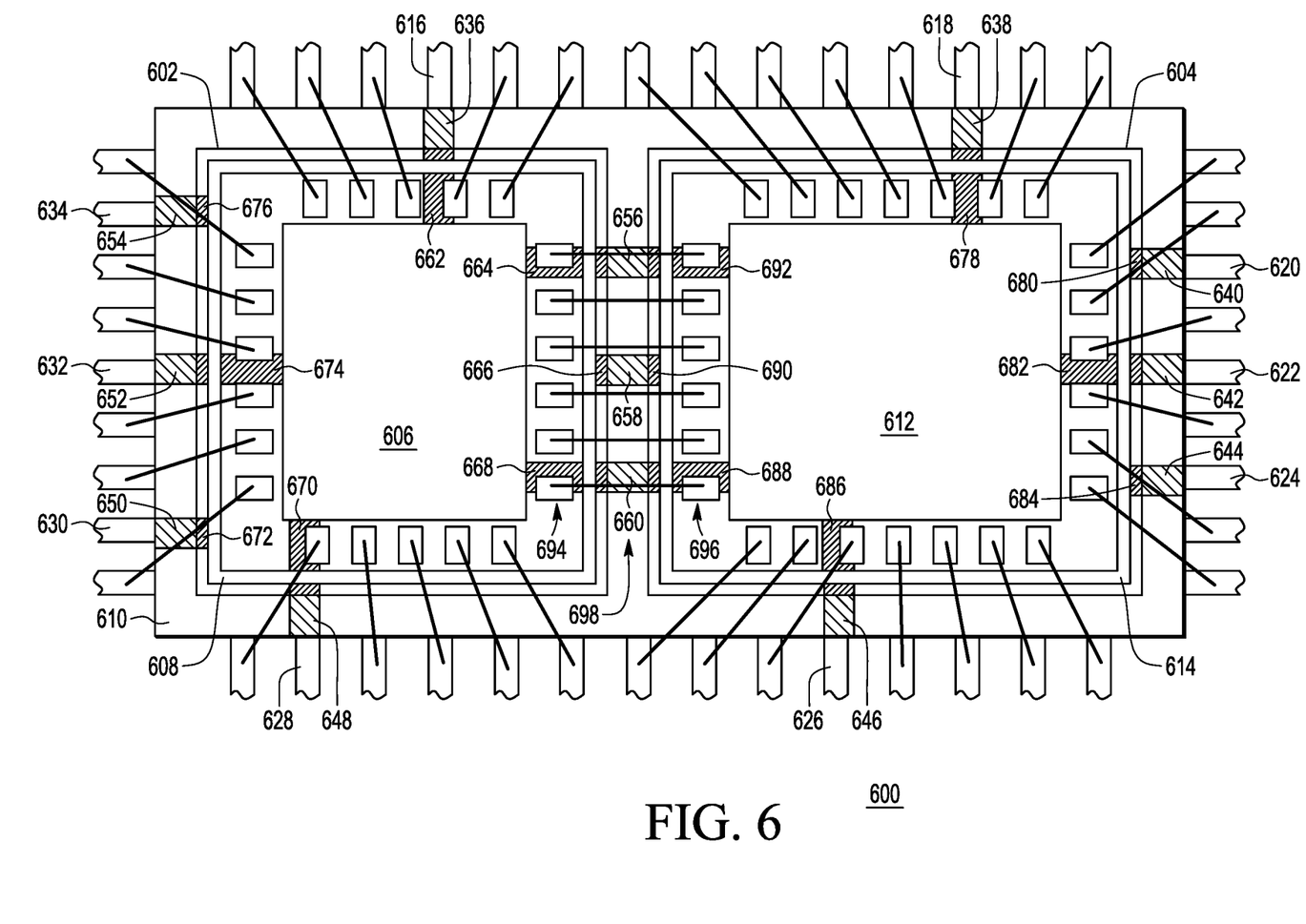
FIG. 6 illustrates, in a plan view, an example semiconductor device having multiple semiconductor dies at a stage of manufacture in accordance with an embodiment.

FIG. 6 illustrates, in a plan view, an example semiconductor device 600 having multiple semiconductor dies at a stage of manufacture in accordance with an embodiment. Device 600 includes a first semiconductor die 602, a second semiconductor die 604, gasket 610, and surrounding package leads. Device 600 may be formed with any number of die where it is desirable to interconnect such die within a package. For example, die 602 may be a sensor die and die 604 may be a microcontroller die.

In this embodiment, sidewalls of die 602 abut first inner sidewalls of gasket 610 and sidewalls of die 604 abut second inner sidewalls of gasket 610 and ends of the package leads abut outer sidewalls of gasket 610. Die 602, die 604, and gasket 610 are mounted on a same substrate (not shown). A first set of cavities formed in the gasket 610 have openings through the inner and outer sidewalls of the gasket 610 and a second set of cavities formed in gasket 610 have openings through first and second inner sidewalls. Metal tabs 662-676 are exposed at one end through the sidewalls of die 602 and are coupled to embedded metal layers and circuitry 606 within die 602. Likewise, metal tabs 678-692 are exposed at one end through the sidewalls of die 604 and are coupled to embedded metal layers and circuitry 612 within die 604. Exposed portions of metal tabs 662-692 are collocated with respective inner sidewall openings of the cavities formed in gasket 610 and ends of leads 616-634 are collocated with respective outer sidewall openings of the cavities.

Conductive pillars 636-654 are located in respective cavities and serve to form package to die electrical connections between leads 616-634 and metal tabs 662, 670-686 and die to die electrical connections between metal tabs 664-668 of die 602 and metal tabs 688-692 of die 604. In this embodiment, die to die electrical connections are formed with conductive pillars 656-660 (e.g., between metal tabs 664-668 and metal tabs 688-692) and bond wires 698. For example, a first end metal tab 664 is electrically connected to a first end of metal tab 692 by way of conductive pillar 656 located in respective cavity of gasket 610. A second end of metal tab 664 is connected to core circuitry 606 of die 602 and a second end of metal tab 692 is connected to core circuitry 612 of die 604. In this example, metal tabs 664 and 692 may be coupled to provide power or ground voltage to core circuitry by way of one or more aforementioned package to die connections coupled to a respective power or ground voltage supply terminal.

Generally, there is provided, a semiconductor device including a substrate having a top surface; a gasket affixed to the top surface of the substrate, the gasket having at least one cavity with a portion of the cavity open to a sidewall of the gasket; a semiconductor die attached to the top surface of the substrate, a sidewall of the semiconductor die abutted with the sidewall of the gasket and having a portion of a metal layer exposed to the open portion of the cavity; and a pillar located in the cavity and electrically connected to the exposed portion of the metal layer. The pillar may include a reflowable conductive material and is configured to reflow when subjected to a predetermined amount of heat to form the electrical connection. The device may further include a leadframe having a first lead electrically connected to the exposed portion of the metal layer by way of the pillar. The first lead may be configured to provide a ground voltage to the semiconductor die. The leadframe may further include a second lead electrically connected to a bond pad located on a top surface of the semiconductor die by way of a bond wire. The exposed portion of the metal layer may be coupled to circuitry within the semiconductor die. The exposed portion of the metal layer may be coupled to at least a portion of a seal ring formed in the metal layer of the semiconductor die. The substrate may include a ceramic material having a conductive layer formed at the top surface. The cavity may include an opening at the bottom and wherein the pillar located in the cavity forms an electrical connection with the conductive layer and the exposed portion of the metal layer. The gasket may be formed from a plastic, ceramic, or dielectric material and is formed as a ring having a rectangular or square shape, the ring having inner opening dimensions substantially similar to outer dimensions of the semiconductor die.

In another embodiment, there is provided, a semiconductor device including a substrate having a top surface; a non-conductive gasket affixed to the top surface of the substrate, the gasket having a first cavity with a first portion of the first cavity open to a first sidewall of the gasket; a first semiconductor die having a portion of a first metal layer exposed through a sidewall, the first semiconductor die attached to the top surface of the substrate and abutted with the first sidewall of the gasket such that the exposed portion of the first metal layer and the open first portion of the first cavity are collocated; and a first pillar located in the first cavity and electrically connected to the exposed portion of the first metal layer. The first pillar may include a copper pillar with a reflowable conductive material formed around the copper pillar, the first pillar configured to reflow when subjected to a predetermined amount of heat to form the electrical connection. The substrate may include a conductive layer formed at the top surface. The device may further include a second portion of the gasket having a second cavity, the second cavity having an opening at the bottom, and wherein a second pillar located in the second cavity forms an electrical connection with the conductive layer and a package lead. The device may further include a second semiconductor die having a portion of a second metal layer exposed through a sidewall, the second semiconductor die attached to the top surface of the substrate and abutted with a second sidewall of the gasket such that the exposed portion of the second metal layer and a second open portion of the first cavity at the second sidewall are collocated, and wherein an electrical connection is formed between the first metal layer of the first semiconductor die and the second metal layer of the second semiconductor die by way of the pillar located in the first cavity. The exposed portion of the first metal layer may be coupled to circuitry within the first semiconductor die and the exposed portion of the second metal layer is coupled to circuitry within the second semiconductor die. The exposed portion of the first metal layer may have a width dimension in a range of 10 microns to 100 microns at the sidewall of the first semiconductor die.

In yet another embodiment, there is provided, a method including forming a first cavity in a first portion of a gasket, the first cavity having a first open portion on a first sidewall of the gasket and a second open portion on a second sidewall of the gasket; attaching the gasket to a top surface of a substrate; attaching a semiconductor die having a portion of a first metal layer exposed through a first sidewall to the top surface of the substrate and abutted with the first sidewall of the gasket, the exposed portion of the first metal layer collocated with the first open portion on the first sidewall of the gasket; and reflowing a pillar located in the first cavity to form an electrical connection with the exposed portion of the first metal layer. The method may further include providing a leadframe abutted with the second sidewall of the gasket, an end of a lead of the leadframe collocated with the second open portion on the second sidewall of the gasket, and wherein reflowing the pillar forms an electrical connection between the exposed portion of the first metal layer and the lead. The method may further include forming a second cavity in a second portion of the gasket, the second portion of the gasket having a third sidewall abutted with a second sidewall of the semiconductor die, a second metal layer exposed through the second sidewall of the semiconductor die; and reflowing a second pillar located in the second cavity to form an electrical connection with the exposed portion of the second metal layer.

By now it should be appreciated that there has been provided, a semiconductor device having electrical connections formed through sidewalls of a semiconductor die. Metal tabs formed from metal layers of the semiconductor die extend through the sidewalls such that cross-sectional surfaces of the metal tabs are exposed at the sidewalls. A gasket surrounding the semiconductor die is formed having cavities collocated with the exposed portions of the metal tabs. Conductive pillars located in the cavities form electrical connections with the exposed portions of the metal tabs. By forming electrical connections through sidewall of the semiconductor die, package to die connections can be realized without using bond pads.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a substrate having a top surface;
a gasket affixed to the top surface of the substrate, the gasket having at least one cavity with a portion of the at least one cavity open to a sidewall of the gasket;
a semiconductor die attached to the top surface of the substrate, a sidewall of the semiconductor die abutted with the sidewall of the gasket and having a portion of a metal layer exposed to the open portion of the at least one cavity; and
a pillar located in the at least one cavity and electrically connected to the exposed portion of the metal layer.

2. The device of claim 1, wherein the pillar comprises a reflowable conductive material and is configured to reflow when subjected to a predetermined amount of heat to form the electrical connection.

3. The device of claim 1, further comprising a leadframe having a first lead electrically connected to the exposed portion of the metal layer by way of the pillar.

4. The device of claim 3, wherein the first lead is configured to provide a ground voltage to the semiconductor die.

5. The device of claim 3, wherein the leadframe further comprises a second lead electrically connected to a bond pad located on a top surface of the semiconductor die by way of a bond wire.

6. The device of claim 1, wherein the exposed portion of the metal layer is coupled to circuitry within the semiconductor die.

7. The device of claim 6, wherein the exposed portion of the metal layer is coupled to at least a portion of a seal ring formed in the metal layer of the semiconductor die.

8. The device of claim 1, wherein the substrate comprises a ceramic material having a conductive layer formed at the top surface.

9. The device of claim 8, wherein the cavity includes an opening at the bottom and wherein the pillar located in the cavity forms an electrical connection with the conductive layer and the exposed portion of the metal layer.

10. The device of claim 1, wherein the gasket is formed from a plastic, ceramic, or dielectric material and is formed as a ring having a rectangular or square shape, the ring having inner opening dimensions substantially similar to outer dimensions of the semiconductor die.

11. A semiconductor device comprising:
a substrate having a top surface;
a non-conductive gasket affixed to the top surface of the substrate, the non-conductive gasket having a first cavity with a first portion of the first cavity open to a first sidewall of the non-conductive gasket;
a first semiconductor die having a portion of a first metal layer exposed through a sidewall, the first semiconductor die attached to the top surface of the substrate and abutted with the first sidewall of the non-conductive gasket such that the exposed portion of the first metal layer and the open first portion of the first cavity are collocated; and
a first pillar located in the first cavity and electrically connected to the exposed portion of the first metal layer.

12. The device of claim 11, wherein the first pillar comprises a copper pillar with a reflowable conductive material formed around the copper pillar, the first pillar configured to reflow when subjected to a predetermined amount of heat to form the electrical connection.

13. The device of claim 11, wherein the substrate includes a conductive layer formed at the top surface.

14. The device of claim 13, further comprising a second portion of the gasket having a second cavity, the second cavity having an opening at the bottom, and wherein a second pillar located in the second cavity forms an electrical connection with the conductive layer and a package lead.

15. The device of claim 11, further comprising a second semiconductor die having a portion of a second metal layer exposed through a sidewall, the second semiconductor die attached to the top surface of the substrate and abutted with a second sidewall of the non-conductive gasket such that the exposed portion of the second metal layer and a second open portion of the first cavity at the second sidewall are collocated, and wherein an electrical connection is formed between the first metal layer of the first semiconductor die and the second metal layer of the second semiconductor die by way of the first pillar located in the first cavity.

16. The device of claim 15, wherein the exposed portion of the first metal layer is coupled to circuitry within the first semiconductor die and the exposed portion of the second metal layer is coupled to circuitry within the second semiconductor die.

17. The device of claim 11, wherein the exposed portion of the first metal layer has a width dimension in a range of 10 microns to 100 microns at the sidewall of the first semiconductor die.

18. A method comprising:
forming a first cavity in a first portion of a gasket, the first cavity having a first open portion on a first sidewall of the gasket and a second open portion on a second sidewall of the gasket;
attaching the gasket to a top surface of a substrate;
attaching a semiconductor die having a portion of a first metal layer exposed through a first sidewall to the top surface of the substrate and abutted with the first sidewall of the gasket, the exposed portion of the first metal layer collocated with the first open portion on the first sidewall of the gasket; and
reflowing a pillar located in the first cavity to form an electrical connection with the exposed portion of the first metal layer.

19. The method of claim 18, further comprising providing a leadframe abutted with the second sidewall of the gasket, an end of a lead of the leadframe collocated with the second open portion on the second sidewall of the gasket, and wherein reflowing the pillar forms an electrical connection between the exposed portion of the first metal layer and the lead.

20. The method of claim 18, further comprising:
forming a second cavity in a second portion of the gasket, the second portion of the gasket having a third sidewall abutted with a second sidewall of the semiconductor die, a second metal layer exposed through the second sidewall of the semiconductor die; and reflowing a second pillar located in the second cavity to form an electrical connection with the exposed portion of the second metal layer.

* * * * *